(12) United States Patent
Park et al.

(10) Patent No.: US 9,502,687 B2
(45) Date of Patent: Nov. 22, 2016

(54) ENCAPSULATION MEMBER AND DISPLAY DEVICE HAVING THE SAME

(71) Applicant: Samsung Display Co., Ltd., Yongin, Gyeonggi-do (KR)

(72) Inventors: Yong-Han Park, Hwaseong-si (KR); Hwang-Keun Kim, Seoul (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/508,901

(22) Filed: Oct. 7, 2014

(65) Prior Publication Data
US 2015/0108535 A1    Apr. 23, 2015

(30) Foreign Application Priority Data
Oct. 21, 2013    (KR) .................. 10-2013-0125025

(51) Int. Cl.
*H01L 51/52* (2006.01)

(52) U.S. Cl.
CPC .................. *H01L 51/5256* (2013.01)

(58) Field of Classification Search
CPC ........... H01L 51/5237; H01L 51/5253; H01L 51/5256; H01L 33/52; H01L 33/54; H01L 33/56; H01L 51/5246; H01L 51/524
See application file for complete search history.

(56) References Cited

U.S. PATENT DOCUMENTS

| | | | |
|---|---|---|---|
| 5,681,615 A | 10/1997 | Affinito et al. | |
| 5,902,641 A | 5/1999 | Affinito et al. | |
| 6,492,026 B1 | 12/2002 | Graff et al. | |
| 8,016,631 B2 * | 9/2011 | Boroson et al. ................ | 445/25 |
| 8,247,809 B2 | 8/2012 | Kim | |
| 8,253,328 B2 | 8/2012 | Hayashi | |
| 8,272,912 B2 | 9/2012 | Kajitani et al. | |
| 9,013,099 B2 * | 4/2015 | Wang et al. .................. | 313/506 |
| 2005/0242720 A1 * | 11/2005 | Sano .................... | H01L 51/5237 313/506 |
| 2008/0164808 A1 | 7/2008 | Kim et al. | |
| 2008/0180022 A1 | 7/2008 | Kwack et al. | |
| 2010/0181903 A1 | 7/2010 | Kim et al. | |
| 2012/0313516 A1 | 12/2012 | Kim et al. | |

FOREIGN PATENT DOCUMENTS

| | | |
|---|---|---|
| JP | 2003-017244 A | 1/2003 |
| JP | 2006-004770 A | 1/2006 |
| KR | 10-2013-0015033 A | 2/2013 |

\* cited by examiner

*Primary Examiner* — Yu Chen
(74) *Attorney, Agent, or Firm* — Knobbe Martens Olson & Bear LLP (57) ABSTRACT

An encapsulation member for a display device is disclosed. In one aspect, the encapsulation layer includes a first layer, a second layer formed over the first layer, and a third layer formed over the second layer. The third layer is formed of the same material as that of the first layer. An end of at least one of the first to third layers has a curved shape.

18 Claims, 8 Drawing Sheets

ENCAPSULATION MEMBER AND DISPLAY DEVICE HAVING THE SAME

CROSS-REFERENCE TO RELATED APPLICATIONS

This application claims priority under 35 USC §119 to Korean Patent Application No. 10-2013-0125025, filed on Oct. 21, 2013 in the Korean Intellectual Property Office (KIPO), the contents of which are incorporated herein in its entirety by reference.

BACKGROUND

1. Field

The described technology generally relates to an encapsulation member and a display device having the same.

2. Description of the Related Technology

Display panels are used in a monitor, a television, a digital information display device, a laptop, a digital camera, a cellular phone, a smart phone, a smart pad, a personal digital assistant (PDA), a portable multimedia player (PMP), an MP3 player, a navigation system, a video camcorder, a game console, etc. Typically, panels include a matrix of light-emitting pixels and driving circuitry sandwiched between two substrates. To protect the internal parts of the panel, it is encapsulated with an air- and water-proof seal.

Furthermore, with the advent of flexible panels having flexible substrates, protection layers must also be flexible. The encapsulation coating generally includes multiple layers, but failure may still occur.

SUMMARY OF CERTAIN INVENTIVE ASPECTS

One inventive aspect is an encapsulation member having improved moisture-proof properties and improved flexibility.

Another aspect is a display device having the encapsulation member.

Another aspect is an organic light-emitting diode (OLED) display including a first material layer, a second material layer, and a third material layer. The second material layer may be disposed on the first material layer. The third material layer may be disposed on the second material and may include a material substantially the same as a material of the first material layer. At least one of an end portion of the first material layer, an end portion of the second material layer, and an end portion of the third material layer may have a concave portion and a convex portion.

The first material layer may have a first curved shape end portion in which first convex patterns and first concave patterns are alternately arranged.

The second material layer may have a first linear shape end portion that partially covers the first curved shape end portion of the first material layer to partially expose the first curved shape end portion of the first material layer.

The third material layer may have a second curved shape end portion in which second convex patterns that cover exposed portions of the first curved shape end portion of the first material layer and second concave patterns that partially expose the first linear shape end portion of the second material layer are alternately arranged.

The first material layer may have a third curved shape end portion in which third convex patterns and third concave patterns are alternately arranged.

The second material layer may have a fourth curved shape end portion in which fourth convex patterns that cover the third concave patterns of the first material layer and fourth concave patterns that expose the third convex patterns of the first material layer are alternately arranged.

The third material layer may have a fifth curved shape end portion in which fifth convex patterns that cover the fourth concave patterns of the second material layer and fifth concave patterns that expose the fourth convex patterns of the second material layer are alternately arranged.

The first material layer may correspond to an inorganic material layer, the third material layer may correspond to the inorganic material layer, and the second material layer may correspond to an organic material layer.

The inorganic material layer may include at least one of aluminum oxide (AlOx), titanium oxide (TiOx), magnesium oxide (MgOx), tin oxide (SnOx), zinc oxide (ZnOx), copper oxide (CuOx), silicon oxide (SiOx), or silicon nitride (SiNx).

The organic material layer may include at least one of epoxy resin, acrylate resin, and urethane acrylate resin.

The first material layer may correspond to an organic material layer, the third material layer may correspond to the organic material layer, and the second material layer may correspond to an inorganic material layer.

The area of the third material layer may be substantially larger than the area of the first material layer.

Another aspect is an OLED display including a substrate, a display structure, and an encapsulation member. The display structure may be disposed on the substrate. The encapsulation member may be disposed on the substrate and may encapsulate the display structure. The encapsulation member may include a first material layer, a second material layer, and a third material layer. The second material layer may be disposed on the first material layer. The third material layer may be disposed on the second material and may include a material substantially the same as a material of the first material layer. At least one of an end portion of the first material layer, an end portion of the second material layer, and an end portion of the third material layer may have a concave portion and a convex portion.

The first material layer may have a first curved shape end portion in which first convex patterns and first concave patterns are alternately arranged.

The second material layer may have a first linear shape end portion that partially covers the first curved shape end portion of the first material layer to partially expose the first curved shape end portion of the first material layer.

The third material layer may have a second curved shape end portion in which second convex patterns that cover exposed portions of the first curved shape end portion of the first material layer and second concave patterns that partially expose the first linear shape end portion of the second material layer are alternately arranged.

The first material layer may have a third curved shape end portion in which third convex patterns and third concave patterns are alternately arranged.

The second material layer may have a fourth curved shape end portion in which fourth convex patterns that cover the third concave patterns of the first material layer and fourth concave patterns that expose the third convex patterns of the first material layer are alternately arranged.

The third material layer may have a fifth curved shape end portion in which fifth convex patterns that cover the fourth concave patterns of the second material layer and fifth concave patterns that expose the fourth convex patterns of the second material layer are alternately arranged.

The area of the third material layer may be substantially larger than the area of the first material layer.

According to at least one embodiment, the encapsulation member may have an improved moisture-proof property due to the encapsulation member including a region with only inorganic material layers and may have an improved flexibility due to the encapsulation member including a region with only organic material layers.

Another aspect is a method of manufacturing an encapsulation member including forming a first material layer having a first curved shape end portion, forming a second material layer having a first linear shape end portion that partially exposes the first curved shape end portion on the first material layer, and forming a third material layer having a second curved shape end portion that covers the first curved shape end portion of the first material layer on the second material layer. Thus, the encapsulation member may include both a region in which only inorganic material layers are stacked and a region in which only organic material layers are stacked. As a result, the encapsulation member may achieve both improved moisture-proof properties and improved flexibility.

Another aspect is a display device including a substrate, a display unit having a plurality of pixels formed over the substrate, and an encapsulation member formed over the substrate and encapsulating the display unit, wherein the encapsulation member includes a plurality of layers stacked on each other, and wherein at least two of the layers have different lengths.

The encapsulation member includes a first layer having a first end, a second layer formed over the first layer and having a second end partially covering the first end, and a third layer formed over the second layer and having a third end partially covering the second end, wherein the third layer is formed of the same material as the first layer.

The first end has a first curved shape forming a plurality of non-linear portions that are not covered by the second layer. The third end has a third curved shape forming a plurality of non-linear portions not covering the second end and wherein the third layer substantially completely overlaps the first layer.

DETAILED DESCRIPTION OF CERTAIN INVENTIVE EMBODIMENTS

The standard display device includes an encapsulation member that protects a display panel from the external environment. However, typical encapsulation members do not have both the desired levels of moisture-proof properties and flexibility.

Hereinafter, the described technology will be explained in detail with reference to the accompanying drawings.

Figure 1:
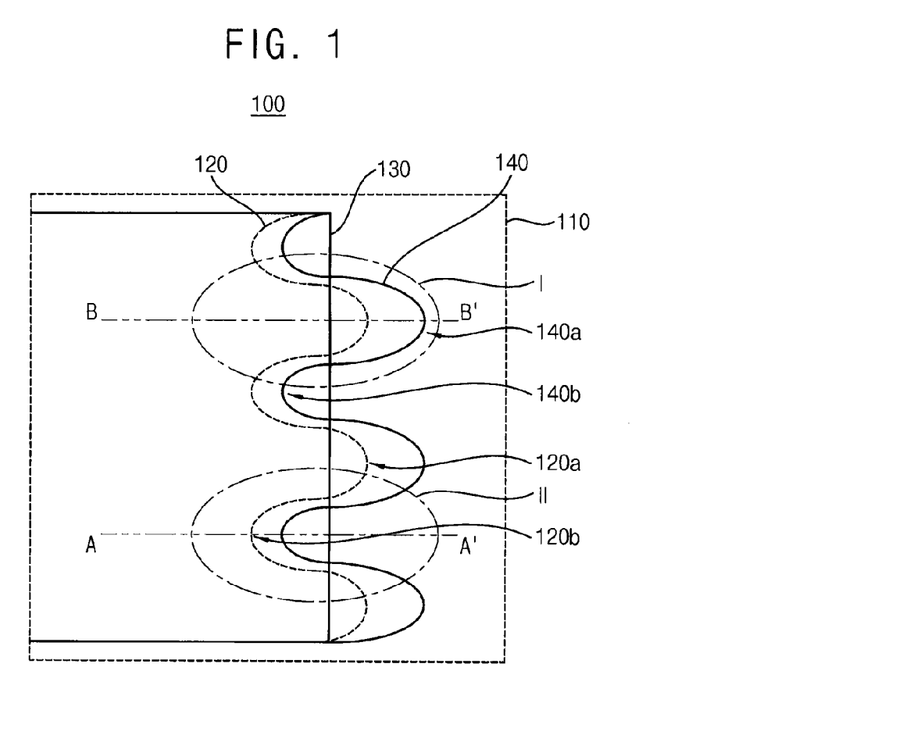
FIG. 1 is a plan view illustrating an encapsulation member according to an embodiment.
Figure 2A:
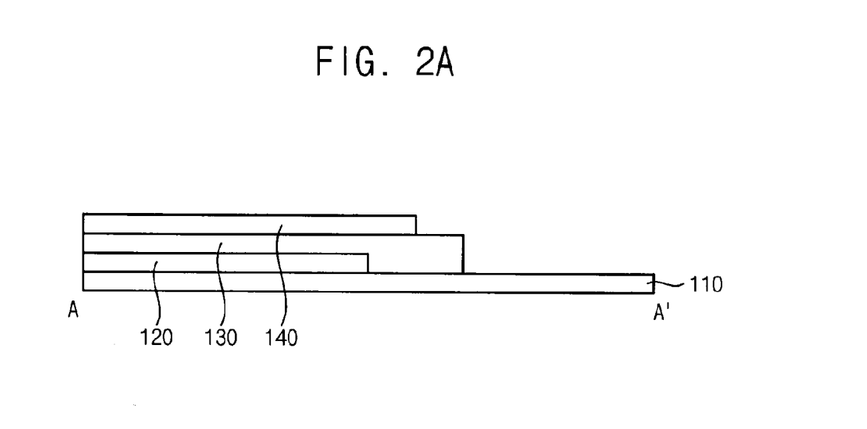
FIG. 2A is a cross-sectional view taken along line A-A' of FIG. 1.
Figure 2B:
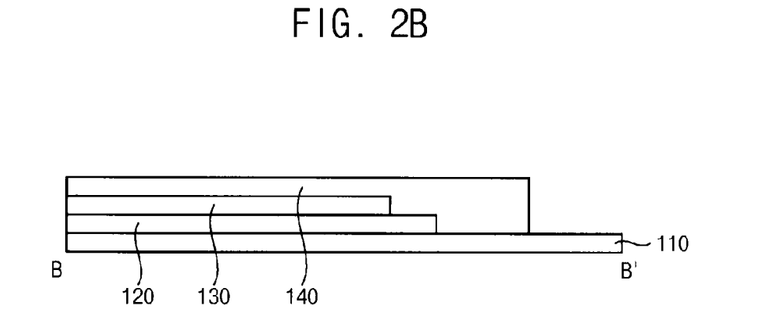
FIG. 2B is a cross-sectional view taken along line B-B' of FIG. 1.

Referring to FIGS. 1 through 2B, an encapsulation member 100 is formed on a substrate 110 including a display structure. The encapsulation member 100 includes a first material layer or first layer 120, a second material layer or second layer 130, and a third material layer or third layer 140. Here, the display structure may be an organic light-emitting diode (OLED) display structure having an organic light-emitting layer. Alternatively, the display structure may be a liquid crystal display (LCD) structure having a liquid crystal layer. According to some embodiments, the encapsulation member 100 has a thin film structure in which the first to third material layers 120 to 140 are sequentially stacked.

The substrate 110 may include a transparent insulation substrate. In some embodiments, the substrate 110 includes a flexible substrate. In other embodiments, the substrate 110 includes a glass substrate, a quartz substrate, a transparent resin substrate, etc.

The first material layer 120 is formed on the substrate 110. The first material layer 120 encapsulates a space between the substrate 110 and the first material layer 120 to prevent moisture and/or oxygen from penetrating from the environment into the space. Here, the first material layer 120 includes a first curved shape end portion in which first convex patterns or convex portions 120a and first concave patterns or concave portions 120b are alternately arranged.

For convenience of descriptions, a region in which the first convex patterns 120a are arranged on the substrate 110 may be defined as a convex portion I, and a region in which the concave patterns 120b are arranged on the substrate 110 may be defined as a concave portion II. Hence, at least one material layer (e.g., the first material layer 120) may include the convex portion I and/or the concave portion II from a top view (i.e., plan view).

According to some embodiments, the amplitude of the first convex patterns 120a in the direction that the first convex patterns 120a are arranged is between about 80 um and about 500 um. Further, the amplitude of the first concave patterns 120b in the direction that the first concave patterns 120b are arranged is also between about 80 um to about 500 um. However, the amplitudes of the first convex patterns 120a and the first concave patterns 120b are not limited thereto.

In some embodiments, the first material layer 120 may include an inorganic material layer. For example, the first material layer 120 may include at least one of aluminum oxide (AlOx), titanium oxide (TiOx), magnesium oxide (MgOx), tin oxide (SnOx), zinc oxide (ZnOx), copper oxide (CuOx), silicon oxide (SiOx), and silicon nitride (SiNx). In other embodiments, the first material layer 120 may include an organic material layer. For example, the first material layer 120 may include at least one of epoxy resin, acrylate resin, and urethane acrylate resin. Thus, the first material layer 120 prevents moisture and/or oxygen from penetrating from the environment into the space (e.g., the space between the substrate 110 and the first material layer 120) and may relieve internal stress in the first and second material layers 120 and 130. In addition, the first material layer 120 may fill micro cracks and/or pin holes in the first and second material layers 120 and 130 to add additional protection against the penetration of moisture and/or oxygen.

The second material layer 130 may be formed on the first material layer 120. The second material layer 130 may include a first linear shape end portion that partially covers the first curved shape end portion of the first material layer 120. Thus, the first curved shape end portion of the first material layer 120 may be partially exposed by the first linear shape end portion of the second material layer 130. Here, the first material layer 120 may include a material different from that of the second material layer 130.

The second material layer 130 includes a convex portion I in which the first linear shape end portion of the second material layer 130 exposes the first curved shape end portion of the first material layer 120 and a concave portion II in which the first linear shape end portion of the second material layer 130 covers the first curved shape end portion of the first material layer 120. In the embodiment of FIG. 1, the area of the second material layer 130 is less than the area of the first material layer 120 in the convex portion I. In addition, the area of the second material layer 130 is greater than the area of the first material layer 120 in the concave portion II.

In some embodiments, the second material layer 130 includes an organic material layer. For example, the second material layer 130 may include at least one of epoxy resin, acrylate resin, or urethane acrylate resin. In other embodiments, the second material layer 130 includes an inorganic material layer. For example, the second material layer 130 may include at least one of aluminum oxide, titanium oxide, magnesium oxide, tin oxide, zinc oxide, copper oxide, silicon oxide, or silicon nitride. Thus, the second material layer 130 may relieve internal stress in the first and third material layers 120 and 140. In addition, the second material layer 130 may fill micro cracks and/or pin holes in the first and third material layers 120 and 140 to prevent moisture and/or oxygen penetration.

The third material layer 140 is formed on the second material layer 130. The third material layer 140 includes a second curved shape end portion in which second convex patterns 140a cover exposed portions of the first curved shape end portion of the first material layer 120 and second concave patterns 140b that partially expose the first linear shape end portion of the second material layer 130. The second convex and concave patterns 140a and 140b are alternately arranged. The third material layer 140 may include a material substantially the same as or similar to that of the first material layer 120 and may have a function substantially the same as or similar to that of the first material layer 120.

The third material layer 140 includes a convex portion I in which the second convex patterns 140a of the second curved shape end portion cover the first linear shape end portion of the second material layer 130 and a concave portion II in which the second concave patterns 140b of the second curved shape end portion partially expose the first linear shape end portion of the second material layer 130. In the embodiment of FIG. 1, the area of the third material layer 140 is greater than the area of the second material layer 130 in the convex portion I. In addition, the area of the third material layer 140 is less than the area of the second material layer 130 in the concave portion II. Thus, at least one material layer (e.g., the first material layer 120 and/or the third material layer 140) may include the convex portion I and/or the concave portion II from a top view (i.e., plan view).

In some embodiments, the third material layer 140 includes an inorganic material layer. For example, the third material layer 140 may include at least one of aluminum oxide, titanium oxide, magnesium oxide, tin oxide, zinc oxide, copper oxide, silicon oxide, or silicon nitride. In other embodiments, the third material layer 140 includes an organic material layer. For example, the third material layer 140 may include at least one of epoxy resin, acrylate resin, or urethane acrylate resin.

According to some embodiments, the first material layer 120, the second material layer 130, and the third material layer 140 may have substantially the same thicknesses. In other embodiments, the first material layer 120, the second material layer 130, and the third material layer 140 may have substantially different thicknesses.

Although it is illustrated that the encapsulation member 100 includes the first through third material layers 120, 130, and 140, the described technology is not limited thereto. For example, the encapsulation member 100 may include a plurality of material layers (i.e., first through (N)th material layers, where N is an integer larger than or equal to 3).

The standard encapsulation member includes a structure in which an inorganic material layer having a linear shape end portion and an organic material layer having a linear shape end portion are alternately stacked. Hence, the end portion of the standard encapsulation member includes a region in which only inorganic material layers are stacked or a region in which only organic material layers are stacked. Thus, when the standard encapsulation member includes an end portion having a region in which only inorganic material layers are stacked, the standard encapsulation member may not achieve desired flexibility. In addition, when the standard encapsulation member includes an end portion having a region in which only organic material layers are stacked, the standard encapsulation member may not achieve desired moisture-proof properties.

In contrast, the encapsulation member 100 according to at least one embodiment includes the first material layer 120 having the first curved end portion and the second material layer 130 having the first linear end portion that partially exposes the first curved end portion of the first material layer 120. As illustrated in FIG. 2A, the second material layer 130 surrounds the first material layer 120. In addition, as illustrated in FIG. 2B, the first material layer 120 and the third material layer 140 surround the second material layer 130. In some embodiments, the first and third material layers 120 and 140 include an inorganic material and the second material layer 130 includes an organic material. In other embodiments, the first and third material layers 120 and 140 include an organic material and the second material layer 130 includes an inorganic material.

As a result, the encapsulation member 100 includes both a region in which only the inorganic material layers are stacked and a region in which only the organic material layers are stacked. Therefore, the encapsulation member 100 achieves improved moisture-proof properties because the encapsulation member 100 includes a region including only inorganic material layers and improved flexibility because the encapsulation member 100 includes a region including only organic material layers.

Figure 3:
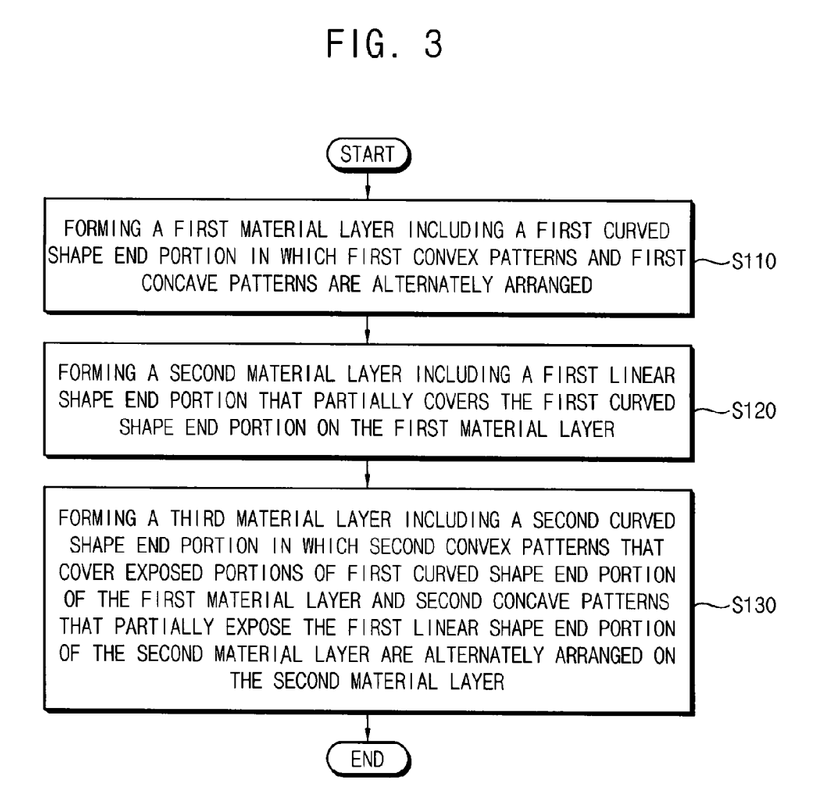
FIG. 3 is a flow chart illustrating a method of manufacturing an encapsulation member according to an embodiment.
Figure 4:
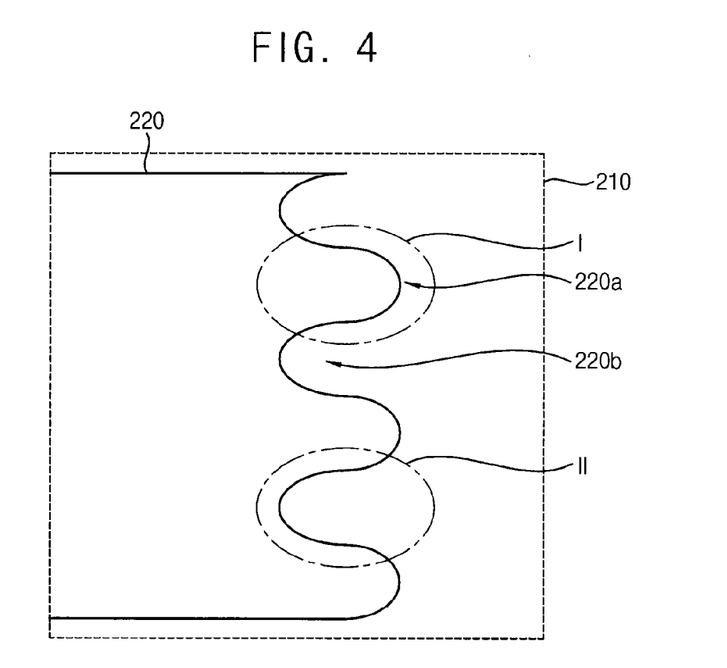
FIGS. 4 through 6 are plan views illustrating the method of FIG. 3.
Figure 5:
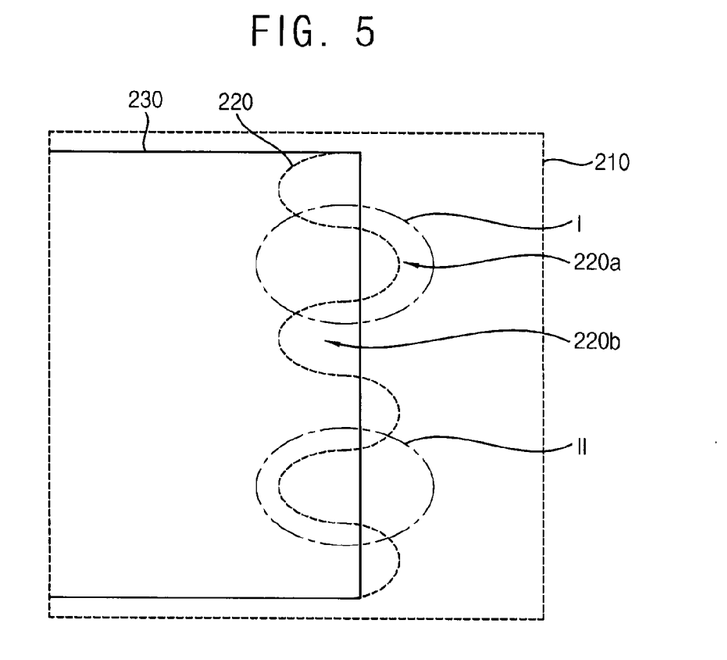
Figure 6:
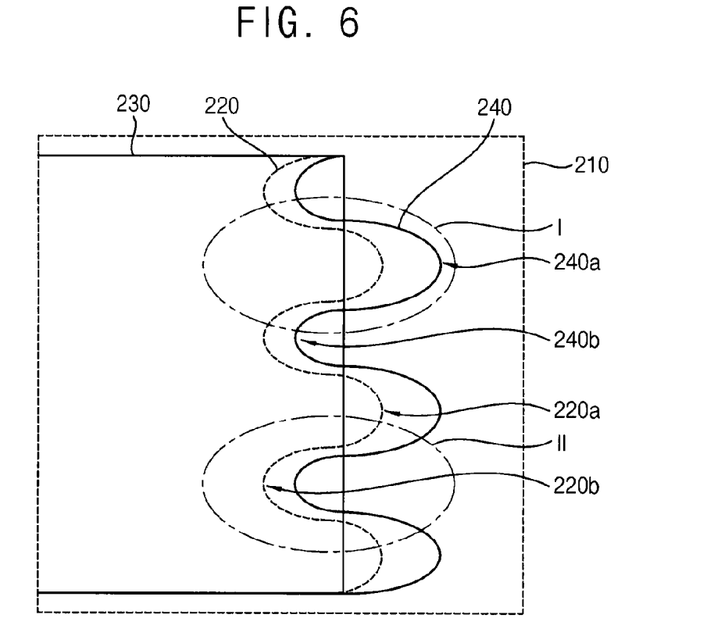

FIG. 3 is a flow chart illustrating a method of manufacturing an encapsulation member according to an embodiment. FIGS. 4 through 6 are plan views illustrating the method of FIG. 3.

Referring to FIGS. 3 through 6, in the method of FIG. 3, a first material layer 220 is formed including a first curved shape end portion in which first convex patterns 220a and first concave patterns 220b are alternately arranged (S110). Next, a second material layer 230 is formed including a first linear shape end portion that partially covers the first curved shape end portion on the first material layer 220 (S120) and a third material layer 240 is formed including a second curved shape end portion in which second convex patterns 240a that cover exposed portions of first curved shape end portion of the first material layer 220 and second concave patterns 240b that partially expose the first linear shape end portion of the second material layer 230 are alternately arranged on the second material layer 230 (S130). In some embodiments, the first material layer 220 includes the same material as that of the third material layer 240. Thus, the encapsulation member may include a substrate 210 on which the first to third material layers 220 to 240 are sequentially stacked.

As illustrated in FIG. 4, the first material layer 220 including the first curved shape end portion in which the first convex patterns 220a and the first concave patterns 220b are alternately arranged may be formed on the substrate 210 (S110). For convenience of descriptions, a region in which the first convex patterns 220a are arranged on the substrate 210 may be defined as a convex portion I and a region in which the concave patterns 220b are arranged on the substrate 210 may be defined as a concave portion II. Hence, at least one material layer (e.g., the first material layer 220) includes the convex portion I and/or the concave portion II from a top view (i.e., plan view).

The substrate 210 may include a transparent insulation substrate. In some embodiments, the substrate 210 includes a flexible substrate. In other embodiments, the substrate 210 includes a glass substrate, a quartz substrate, a transparent resin substrate, etc.

According to some embodiments, the amplitude of the first convex patterns 220a in the direction that the first convex patterns 220a are arranged in is between about 80 um and about 500 um. Additionally, the amplitude of the first concave patterns 220b in the direction that the first concave patterns 220b are arranged in is also between about 80 um and about 500 um. However, the amplitudes of the first convex patterns 220a and the first concave patterns 220b are not limited thereto.

In some embodiments, the first material layer 220 includes an inorganic material layer. For example, the first material layer 220 may include at least one of aluminum oxide, titanium oxide, magnesium oxide, tin oxide, zinc oxide, copper oxide, silicon oxide, or silicon nitride. In other embodiments, the first material layer 220 include an organic material layer. For example, the first material layer 220 may include at least one of epoxy resin, acrylate resin, or urethane acrylate resin.

When the first material layer 220 includes an inorganic material layer, the first material layer 220 may be formed by a screen printing process using aluminum oxide, titanium oxide, magnesium oxide, tin oxide, zinc oxide, copper oxide, silicon oxide, silicon nitride, etc. Hence, the first material layer 220 may encapsulate a space (e.g., the space between the substrate 210 and the first material layer 220) to prevent moisture and/or oxygen from penetrating from the environment into the space.

When the first material layer 220 includes an organic material layer, the first material layer 220 may be formed by the screen printing process using epoxy resin, acrylate resin, urethane acrylate resin, etc. Thus, the first material layer 220 may prevent moisture and/or oxygen from penetrating from the environment into the space and may relieve internal stress in the first and second material layers 220 and 230. In addition, the first material layer 220 may fill micro cracks and/or pin holes in the first and second material layers 220 and 230 to prevent moisture and/or oxygen penetration.

As illustrated in FIG. 5, the second material layer 230 including a first linear shape end portion partially covering the first curved shape end portion of the first material layer 220 partially exposes the first curved shape end portion of the first material layer 220 on the first material layer 220 (S120)

In other words, the second material layer 230 partially exposes the first material layer 220. In some embodiments, the second material layer 230 has a material different from the material of the first material layer 220.

The second material layer 230 includes a convex portion I in which the first linear shape end portion of the second material layer 230 exposes the first curved shape end portion of the first material layer 220 and a concave portion II in which the first linear shape end portion of the second material layer 230 covers the first curved shape end portion of the first material layer 220. In these embodiments, the area of the second material layer 230 is less than the area of the first material layer 220 in the convex portion I. In addition, the area of the second material layer 230 is greater than the area of the first material layer 220 in the concave portion II.

In some embodiments, the second material layer 230 includes an organic material layer. For example, the second material layer 230 may include at least one of epoxy resin, acrylate resin, or urethane acrylate resin. In other embodiments, the second material layer 230 includes an inorganic material layer. For example, the second material layer 230 may include at least one of aluminum oxide, titanium oxide, magnesium oxide, tin oxide, zinc oxide, copper oxide, silicon oxide, or silicon nitride. In some embodiments, when the first material layer 220 includes an inorganic material layer, the second material layer 230 includes the organic material layer. In other embodiments, when the first material layer 220 includes an organic material layer, the second material layer 230 includes an inorganic material layer.

When the second material layer 230 includes an organic material layer, the second material layer 230 may be formed by a spin coating process, a printing process, a chemical vapor deposition process, etc using aluminum oxide, titanium oxide, magnesium oxide, tin oxide, zinc oxide, copper oxide, silicon oxide, silicon nitride, etc. Thus, the second material layer 230 may fill micro cracks and/or pin holes in the first and second material layers 220 and 230 to prevent moisture and/or oxygen penetration.

When the second material layer 230 includes an inorganic material layer, the second material layer 230 may be formed by the chemical vapor deposition process, a sputtering process, an atomic layer deposition process, a plasma enhanced chemical vapor deposition process, etc using epoxy resin, acrylate resin, urethane acrylate resin, etc. Hence, the second material layer 230 may prevent moisture and/or oxygen from penetrating from the environment into the space between the substrate 410 and the second material layer 230.

As illustrated in FIG. 6, the third material layer 240 including a second curved shape end portion in which second convex patterns 240a that cover exposed portions of first curved shape end portions of the first material layer 220 and second concave patterns 240b that partially expose the first linear end portion of the second material layer 230 are alternately arranged is formed on the second material layer 230 (S130). Thus, the third material layer 240 includes the same or a similar material to that of the first material layer 220 and functions substantially the same as or similar to the first material layer 220.

The area of the third material layer 240 is greater than the area of the first material layer 220. That is, the third material layer 240 may entirely cover the first material layer 220 and may partially expose the second material layer 230.

The third material layer 240 includes a convex portion I in which the second convex patterns 240a of the second curved shape end portion of the third material layer 240 cover the first linear shape end portion of the second material layer 230 and a concave portion II in which the second concave patterns 240b of the second curved shape end portion of the third material layer 240 partially expose the first linear shape end portion of the second material layer 230. In these embodiments, the area of the third material layer 140 is greater than the area of the second material layer 230 in the convex portion I. Additionally, the area of the third material layer 140 is less than the area of the second material layer 230 in the concave portion II. Thus, at least one material layer (e.g., the first material layer 220 and/or the third material layer 240) may include the convex portion and/or the concave portion from a top view (i.e., plan view).

In some embodiments, the third material layer 240 includes an inorganic material layer. For example, the third material layer 240 may include at least one of aluminum oxide, titanium oxide, magnesium oxide, tin oxide, zinc oxide, copper oxide, silicon oxide, or silicon nitride. In other embodiments, the third material layer 240 includes an organic material layer. For example, the third material layer 240 may include at least one of epoxy resin, acrylate resin, or urethane acrylate resin.

When the third material layer 240 includes an inorganic material layer, the third material layer 240 may be formed by a screen printing process using aluminum oxide, titanium oxide, magnesium oxide, tin oxide, zinc oxide, copper oxide, silicon oxide, silicon nitride, etc.

When the third material layer 240 includes an organic material layer, the third material layer 240 may be formed by the screen printing process using epoxy resin, acrylate resin, urethane acrylate resin, etc. For example, when the second material layer 230 includes an organic material layer, the third material layer 240 includes an inorganic material layer. In other embodiments, when the second material layer 230 includes an inorganic material layer, the third material layer 240 includes an organic material layer.

Although it is illustrated that the encapsulation member includes the first through third material layers 220, 230 and 240, the described technology is not limited thereto. For example, the encapsulation member may include a plurality of material layers (i.e., first through (N)th material layers, where N is an integer larger than or equal to 3).

The standard encapsulation member includes a structure in which an inorganic material layer having a linear shape end portion and an organic material layer having a linear shape end portion are alternately stacked. Hence, the end portion of the standard encapsulation member includes a region in which only inorganic material layers are stacked or a region in which only organic material layers are stacked. Thus, if the standard encapsulation member includes an end portion having a region in which only inorganic material layers are stacked, the standard encapsulation member may not achieve desired flexibility. In addition, if the standard encapsulation member includes an end portion having a region in which only organic material layers are stacked, the standard encapsulation member may not achieve desired moisture-proof properties.

The method of FIG. 3 may include manufacturing the encapsulation member by forming the first material layer 220 including the first curved shape end portion in which the first convex patterns 220a and the first concave patterns 220b are alternately arranged, forming the second material layer 230 including the first linear shape end portion that partially covers the first curved shape end portion on the first material layer 220, and forming the third material layer 240 including the second curved shape end portion in which the second convex patterns 240a that cover exposed portions of the first curved shape end portion of the first material layer 220 and the second concave patterns 240b that partially exposes the first linear shape end portion of the second material layer 230 on the second material layer 230. In some embodiments, the first and third material layers 120 and 140 include an inorganic material and the second material layer 130 includes an organic material. In other embodiments, the first and third material layers 120 and 140 include an organic material and the second material layer 130 includes an inorganic material.

Figure 7:
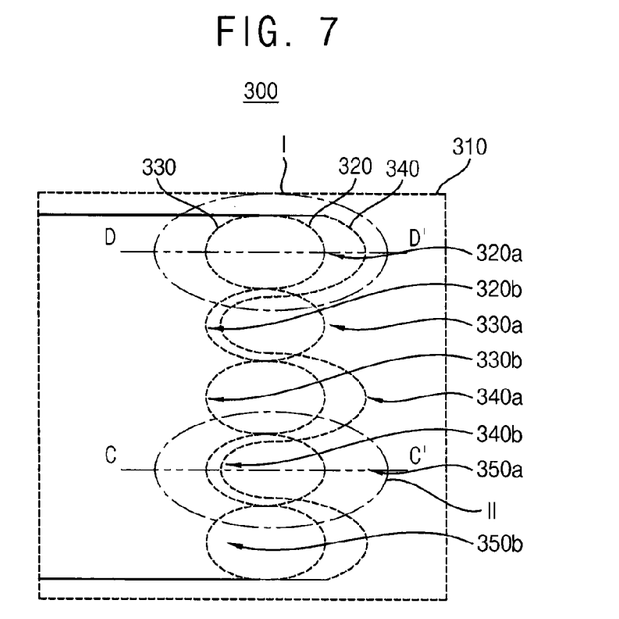
FIG. 7 is a plan view illustrating an encapsulation member according to another embodiment.
Figure 8A:
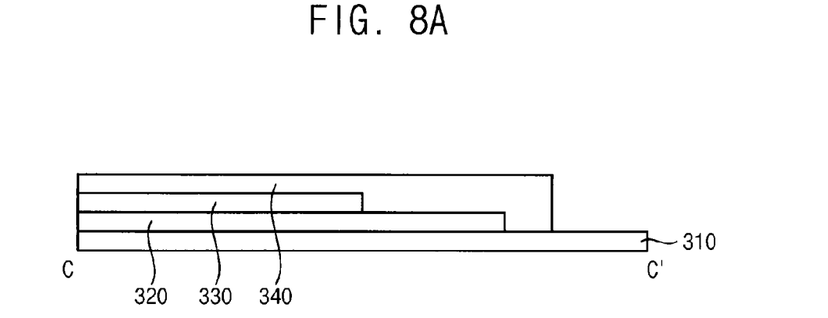
FIG. 8A is a cross-sectional view taken along line C-C' of FIG. 7.
Figure 8B:
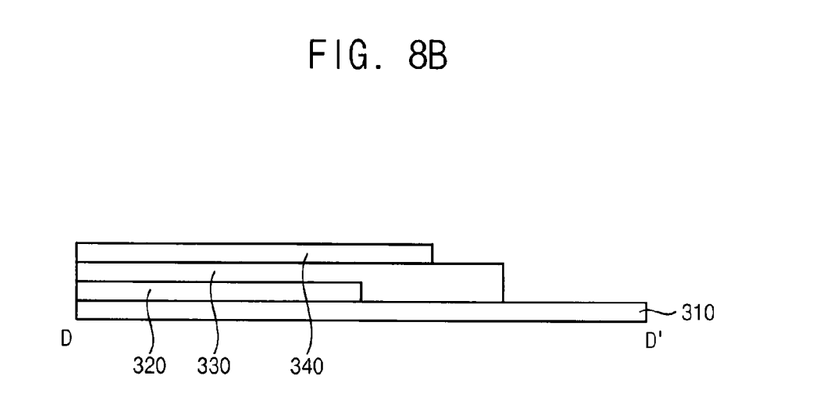
FIG. 8B is a cross-sectional view taken along line D-D' of FIG. 7.

FIG. 7 is a plan view illustrating an encapsulation member according to another embodiment. FIG. 8A is a cross-sectional view taken along line C-C' of FIG. 7. FIG. 8B is a cross-sectional view taken along line D-D' of FIG. 7.

Referring to FIGS. 7 through 8B, an encapsulation member 300 may be disposed on a substrate 310. The encapsulation member 300 may include a first material layer 320, a second material layer 330, and a third material layer 340. In some embodiments, the encapsulation member 300 has a thin film type structure in which the first to third material layers 320 to 340 are alternately stacked.

The substrate 310 may include a transparent insulation substrate. In some embodiments, the substrate 310 includes a flexible substrate. In other embodiments, the substrate 310 include a glass substrate, a quartz substrate, a transparent resin substrate, etc.

The first material layer 320 is formed on the substrate 310. The first material layer 320 may encapsulate a space between the substrate 310 and the first material layer 320 to prevent moisture and/or oxygen from penetrating into the space. In some embodiments, the first material layer 320 include a third curved shape end portion in which third convex portions 320a and third concave portions 320b are alternately arranged.

For convenience of descriptions, a region in which the third convex patterns 320a arranged on the substrate 310 may be defined as a convex portion I and a region in which the third concave patterns 320b are arranged on the substrate 310 may be defined as a concave portion II. Hence, at least one material layer (e.g., the first material layer 320) may include a convex portion I and/or a concave portion II from a top view (i.e., plan view).

In some embodiments, the amplitude of the third convex patterns 320a in the direction that the third convex patterns 320a are arranged is between about 80 um and about 500 um. Additionally, the amplitude of the third concave patterns 320b in the direction that the third concave patterns 320b are arranged is between about 80 um and about 500 um. However, the amplitude of the third convex patterns 320a and the third concave patterns 320b are not limited thereto.

In some embodiments, the first material layer 320 includes an inorganic material layer. For example, the first material layer 320 may include at least one of aluminum oxide, titanium oxide, magnesium oxide, tin oxide, zinc oxide, copper oxide, silicon oxide, or silicon nitride. In other embodiments, the first material layer 320 includes an organic material layer. For example, the first material layer 320 may include at least one of epoxy resin, acrylate resin, or urethane acrylate resin. Thus, the first material layer 320 may prevent moisture and/or oxygen from penetrating into the space (e.g., the space between the substrate 310 and the first material layer 320) and may relieve internal stress in the first and second material layers 320 and 330. In addition, the first material layer 320 may fill micro cracks and/or pin holes in the first and second material layers 320 and 330 to prevent moisture and/or oxygen penetration.

The second material layer 330 is formed on the first material layer 320. The second material layer 330 includes a fourth curved shape end portion in which fourth convex patterns 330a that cover the third concave patterns 320b of the first material layer 320 and fourth concave patterns 330b that expose the third convex patterns 320a of the first material layer 320 are alternately arranged. Thus, the fourth curved shape end portion of the second material layer 330 may partially expose the third curved shape end portion of the first material layer 320. Here, the second material layer 330 may include a material different from that of the first material layer 320.

The second material layer 330 includes a convex portion I in which the fourth curved shape end portion of the second material layer 330 expose the third curved shape end portion of the first material layer 320 and a concave portion II in which the fourth curved shape end portion of the second material layer 330 cover the third curved shape end portion of the first material layer 320. In the FIG. 7 embodiment, the area of the second material layer 330 is less than the area of the first material layer 320 in the convex portion I. In addition, the area of the second material layer 330 is greater than the area of the first material layer 320 in the concave portion II.

In some embodiments, the second material layer 330 includes an organic material layer. For example, the second material layer 330 may include at least one of epoxy resin, acrylate resin, or urethane acrylate resin. In other embodiments, the second material layer 330 includes an inorganic material layer. For example, the second material layer 330 may include at least one of aluminum oxide, titanium oxide, magnesium oxide, tin oxide, zinc oxide, copper oxide, silicon oxide, or silicon nitride. Thus, the second material layer 330 may prevent moisture and/or oxygen from penetrating from the environment into the space, and may relieve internal stress in the first and the third material layers 320 and 340. In addition, the second material layer 330 may fill micro cracks and/or pin holes in the first and third material layers 320 and 340 to prevent moisture and/or oxygen penetration.

The third material layer 340 is formed on the second material layer 330. The third material layer 340 includes a fifth curved shape end portion in which fifth convex patterns 340a that cover the fourth concave patterns 330b of the second material layer 330 and fifth concave patterns 340b that expose the fourth convex patterns 330a of the second material layer 330 are alternately arranged. The third material layer 340 may include a material the same as or similar to that of the first material layer 320 and may function substantially the same as or similar to the first material layer 320.

The third material layer 340 includes a convex portion I in which the fifth convex patterns 340a of the fifth curved shape end portion cover the fourth curved shape end portion of the second material layer 330 and a concave portion II in which the fifth concave patterns 340b of the fifth curved shape end portion partially expose the fourth curved shape end portion of the second material layer 330. In the embodiment of FIG. 7, the area of the third material layer 340 is greater than the area of the second material layer 330 in the convex portion I. In addition, the area of the third material layer 340 is less than the area of the second material layer 330 in the concave portion II. Thus, at least one material layer (e.g., the first material layer 320 and/or the third material layer 340) may include the convex portion I and/or the concave portion II from a top view (i.e., plan view).

In some embodiments, the third material layer 340 includes an inorganic material layer. For example, the third material layer 340 may include at least one of aluminum oxide, titanium oxide, magnesium oxide, tin oxide, zinc oxide, copper oxide, silicon oxide, or silicon nitride. In other embodiments, the third material layer 340 includes an organic material layer. For example, the third material layer 340 may include at least one of epoxy resin, acrylate resin, or urethane acrylate resin.

In some embodiments, the first to third material layers 320 to 340 have substantially the same thicknesses. In other embodiments, the first to third material layers 320 to 340 have different thicknesses.

Although it is illustrated that the encapsulation member 300 includes the first through third material layers 320, 330 and 340, the described technology is not limited thereto. For example, the encapsulation member 300 may include a plurality of material layers (i.e., first through (N)th material layers, where N is an integer larger than or equal to 3).

The standard encapsulation member includes a structure in which an inorganic material layer having a linear shape end portion and an organic material layer having a linear shape end portion are alternately stacked. Thus, the standard encapsulation member includes an end portion in which only inorganic material layers are stacked or an end portion in which only organic material layers are stacked. Accordingly, if the standard encapsulation member includes the end portion in which only the inorganic material layers are stacked, the standard encapsulation member may not achieve desired flexibility. Further, if the standard encapsulation member includes the end portion in which only the organic material layers are stacked, the standard encapsulation member may not achieve desired moisture-proof properties.

On the other hand, the encapsulation member 300 according to at least one embodiment includes the first material layer 320 having the third curved end portion, the second material layer 330 having the fourth curved shape end portion that partially exposes the third curved end portion of the first material layer 320, and the third material layer 340 having the fifth curved shape end portion that covers the third curved end portion of the first material layer 320. As illustrated in FIG. 8A, the second material layer 330 may surround the first material layer 320. In addition, as illustrated in FIG. 8B, the first material layer 320 and the third material layer 340 may surround the second material layer 330. In some embodiments, the first and third material layers 320 and 340 include an inorganic material, and the second material layer 330 includes an organic material. In other embodiments, the first and third material layers 320 and 340 include an organic material, and the second material layer 330 includes an inorganic material.

As a result, the encapsulation member 300 includes both a region in which only inorganic material layers are stacked and a region in which only organic material layers are stacked. Therefore, the encapsulation member 300 may achieve improved moisture-proof properties because the encapsulation member 300 includes the region with only inorganic material layers, and may achieve improved flexibility because the encapsulation member 300 includes the region with only organic material layers.

Figure 9:
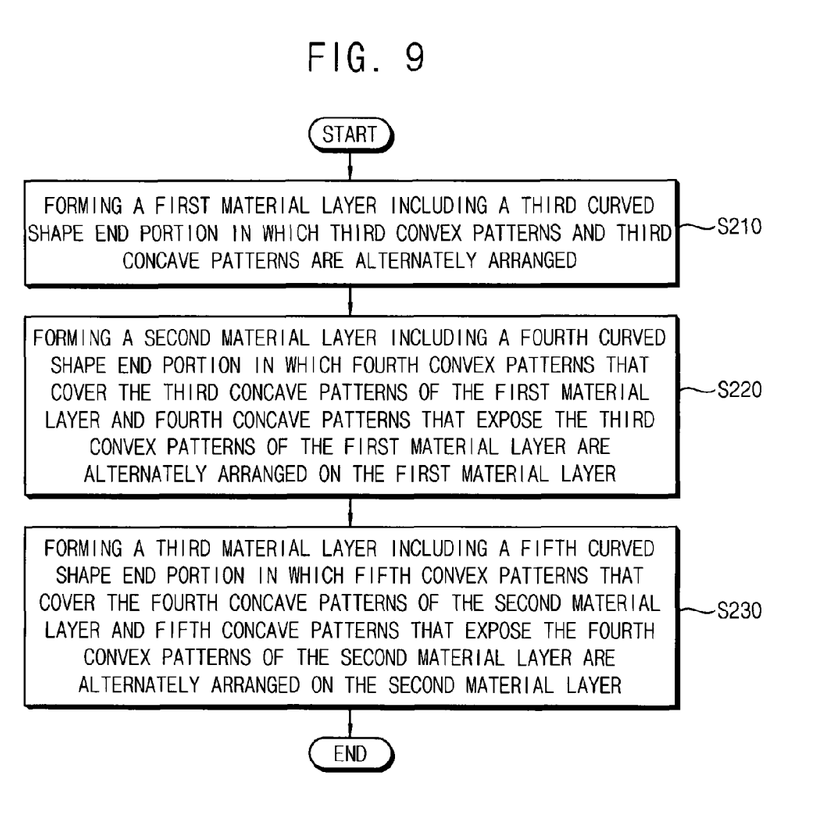
FIG. 9 is a flow chart illustrating a method of manufacturing an encapsulation member according to an embodiment.
Figure 10:
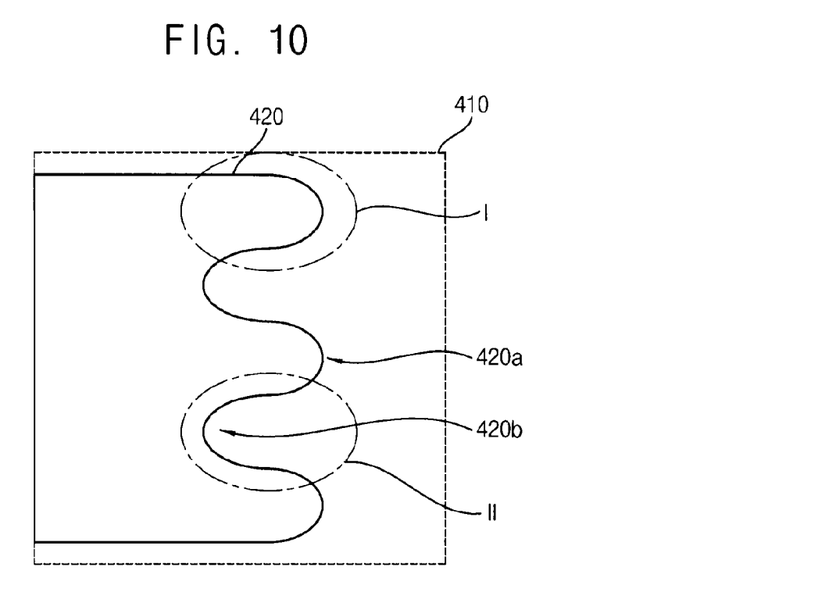
FIGS. 10 through 12 are plan views illustrating the method of FIG. 9.
Figure 11:
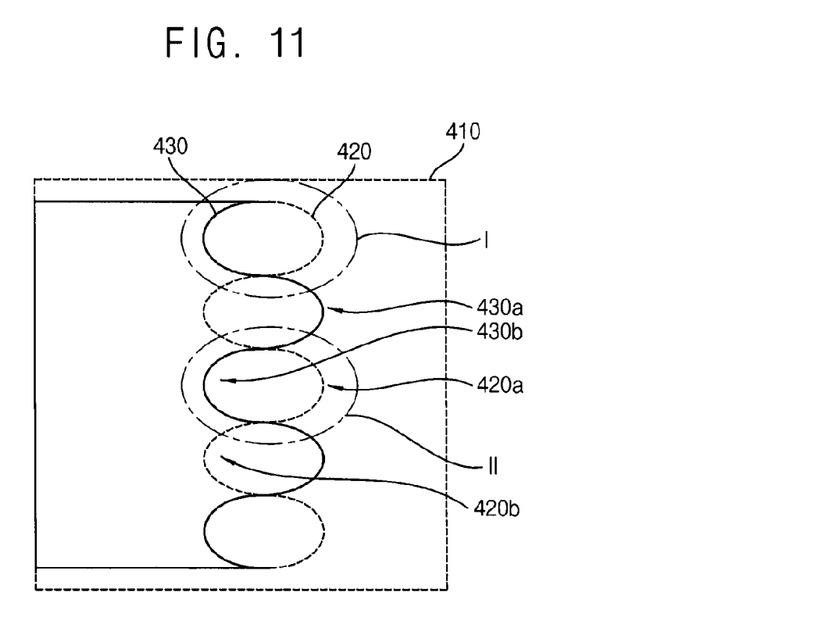
Figure 12:
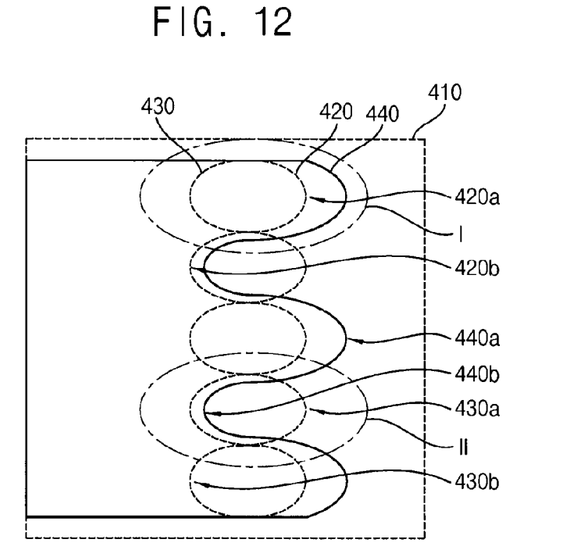

FIG. 9 is a flow chart illustrating a method of manufacturing an encapsulation member according to an embodiment. FIGS. 10 through 12 are plan views illustrating the method of FIG. 9.

Referring to FIGS. 9 through 12, in the method of FIG. 9, a first material layer 420 is formed including a third curved shape end portion in which third convex patterns 420a and third concave patterns 420b are alternately arranged (S210). Next, a second material layer 430 is formed including a fourth curved shape end portion in which fourth convex patterns 430a that cover the third concave patterns 420b of the first material layer 420 and fourth concave patterns 430b that expose the third convex patterns 420a of the first material layer 420 are alternately arranged on the first material layer 420 (S220) and a third material layer 440 is formed including a fifth curved shape end portion in which fifth convex patterns 440a that cover the fourth concave patterns 430b of the second material layer 430 and fifth concave patterns 440b that expose the fourth convex patterns 430a of the second material layer 430 are alternately arranged on the second material layer 430 (S230). In some embodiments, the first material layer 410 includes the same material as that of the third material layer 440. Thus, the manufacture encapsulation member may include a substrate 410 on which the first to third material layers 420 to 440 are sequentially stacked.

As illustrated in FIG. 10, the first material layer 420 including the third curved shape end portion in which the third convex patterns 420a and the third concave patterns 420b are alternately arranged is formed on the first substrate 410 (S210). For convenience of descriptions, a region in which the third convex patterns 420a are arranged on the substrate 410 may be defined as a convex portion I and a region in which the third concave patterns 420b are arranged on the substrate 410 may be defined as a concave portion II. Hence, at least one material layer (e.g., the first material layer 420) includes the convex portion I and/or the concave portion II from a top view (i.e., plan view).

The substrate 410 may include a transparent insulation substrate. In some embodiments, the substrate 410 includes a flexible substrate. In other embodiments, the substrate 410 includes a glass substrate, a quartz substrate, a transparent resin substrate, etc.

According to some embodiments, the amplitude of the third convex patterns 420a in the direction that the third convex patterns 420a are arranged is between about 80 um and about 500 um. Additionally, the amplitude of the third concave patterns 420b in the direction that the third concave patterns 420b are arranged is between about 80 um and about 500 um. However, the amplitude of the third convex patterns 420a and the amplitude of the third concave patterns 420b are not limited thereto.

In some embodiments, the first material layer 420 includes an inorganic material layer. For example, the first material layer 420 may include at least one of aluminum oxide, titanium oxide, magnesium oxide, tin oxide, zinc oxide, copper oxide, silicon oxide, or silicon nitride. In other embodiments, the first material layer 420 includes an organic material layer. For example, the first material layer 420 includes at least one of epoxy resin, acrylate resin, or urethane acrylate resin.

When the first material layer 420 includes an inorganic material layer, the first material layer 420 may be formed by a screen printing process using aluminum oxide, titanium oxide, magnesium oxide, tin oxide, zinc oxide, copper oxide, silicon oxide, silicon nitride, etc. Hence, the first material layer 420 may encapsulate a space between the substrate 410 and the first material layer 420 to prevent moisture and/or oxygen from penetrating from the environment into the space.

When the first material layer 420 includes an organic material layer, the first material layer 420 may be formed by the screen printing process using the epoxy resin, the acrylate resin, the urethane acrylate resin, etc. Thus, the first material layer 420 may prevent moisture and/or oxygen from penetrating from the environment into the space (e.g., the space between the substrate 410 and the first material layer 420) and may relieve internal stress in the first and second material layers 420 and 430. In addition, the first material layer 420 may fill micro cracks and/or pin holes in the first and second material layers 420 and 430 to prevent moisture and/or oxygen penetration.

As illustrated in FIG. 11, the second material layer 430 including the fourth curved shape end portion in which fourth convex patterns 430a that cover the third concave patterns 420b of the first material layer 420 and fourth concave patterns 430b that expose the third convex patterns 420a of the first material layer 420 are alternately arranged is formed on the first material layer 420 (S220).

In other words, the second material layer 430 partially exposes the first material layer 420. For example, the second material layer 430 may include a material different from that of the first material layer 420.

The second curved end portion of the second material layer 430 partially exposes the third convex patterns 420a of the third curved end portion of the first material layer 420 in the convex portion I and covers the third concave patterns 420b of the third curved end portion of the first material layer 420 in the concave portion II. Thus, the area of the second material layer 430 is less than the area of the first material layer 420 in convex portion I. Additionally, the area of the second material layer 430 is greater than the area of the first material layer 420 in the concave portion II. Thus, at least one material layer (e.g., the first material layer 420 and/or the second material layer 430) may include the convex portion I and/or the concave portion II from a top view (i.e., plan view).

In some embodiments, the second material layer 430 includes an organic material layer. For example, the second material layer 430 may include at least one of epoxy resin, acrylate resin, or urethane acrylate resin. In other embodiments, the second material layer 430 includes an inorganic material layer. For example, the second material layer 430 may include at least one of aluminum oxide, titanium oxide, magnesium oxide, tin oxide, zinc oxide, copper oxide, silicon oxide, or silicon nitride. In some embodiments, when the first material layer 420 includes an inorganic material layer, the second material layer 430 includes an organic material layer. In other embodiments, when the first material layer 420 includes an organic material layer, the second material layer 430 includes an inorganic material layer.

When the second material layer 430 includes an organic material layer, the second material layer 430 may be formed by a spin coating process, a printing process, a chemical vapor deposition process, etc using aluminum oxide, titanium oxide, magnesium oxide, tin oxide, zinc oxide, copper oxide, silicon oxide, silicon nitride, etc. Thus, the second material layer 430 may fill micro cracks and/or pin holes in the first and third material layers 420 and 440 to prevent moisture and/or oxygen penetration.

When the second material layer 430 includes an inorganic material layer, the second material layer 430 may be formed by the chemical vapor deposition process, a sputtering process, an atomic layer deposition process, a plasma enhanced chemical vapor deposition process, etc using epoxy resin, acrylate resin, urethane acrylate resin, etc. Hence, the second material layer 430 may prevent moisture and/or oxygen from penetrating from the environment into the space between the substrate 410 and the second material layer 430.

As illustrated in FIG. 12, the third material layer 440 is formed on the second material layer 430. In some embodiments, the third material layer 440 includes the fifth curved shape end portion in which fifth convex patterns 440*a* that cover the fourth concave patterns 430*b* of the second material layer 430 and fifth concave patterns 440*b* that expose the fourth convex patterns 430*a* of the second material layer 430 alternately arranged on the second material layer 430 (S230). Here, the third material layer 440 may include a material the same as or similar to that of the first material layer 420 and may function the same as or similar to the first material layer 420.

The area of the third material layer 440 is greater than the area of the first material layer 420. That is, the third material layer 440 may entirely cover the first material layer 420 and may partially expose the second material layer 430.

The fifth convex patterns 440*a* of the fifth curved shape end portion of the third material layer 440 cover the fourth curved shape end portion of the second material layer 430 in the convex portion I and the fifth concave patterns 440*b* of the fifth curved shape end portion of the third material layer 440 partially expose the fourth curved shape end portion of the second material layer 430 in the concave portion II. In some embodiments, the area of the third material layer 440 is greater than the area of the second material layer 430 in the convex portion I. In other embodiments, the area of the third material layer 440 is less than the area of the second material layer 430 in the concave portion II. Thus, at least one material layer (e.g., the first material layer 420 and/or the third material layer 440) includes the convex portion I and/or the concave portion II from a top view (i.e., plan view).

In some embodiments, the third material layer 440 includes the inorganic material layer. For example, the third material layer 440 may include at least one of aluminum oxide, titanium oxide, magnesium oxide, tin oxide, zinc oxide, copper oxide, silicon oxide, or silicon nitride. In other embodiments, the third material layer 440 includes the organic material layer. For example, the third material layer 440 may include at least one of epoxy resin, acrylate resin, or urethane acrylate resin.

When the third material layer 440 includes an inorganic material layer, the third material layer 440 may be formed by a screen printing process using aluminum oxide, titanium oxide, magnesium oxide, tin oxide, zinc oxide, copper oxide, silicon oxide, silicon nitride, etc. In some embodiments, when the second material layer 430 includes an organic material layer, the third material layer 440 includes an inorganic material layer. In other embodiments, when the second material layer 430 includes an inorganic material layer, the third material layer 440 includes an organic material layer.

When the third material layer 440 includes an organic material layer, the third material layer 440 may be formed by the screen printing process using epoxy resin, acrylate resin, urethane acrylate resin, etc.

Although it is illustrated that the encapsulation member includes the first through third material layer 420, 430 and 440, the described technology is not limited thereto. For example, the encapsulation member may include a plurality of material layers (i.e., first through (N)th material layers, where N is an integer larger than or equal to 3).

The standard encapsulation member includes a structure in which an inorganic material layer having a linear shape end portion and an organic material layer having a linear shape end portion are alternately stacked. Accordingly, if the standard encapsulation member includes the end portion in which only the inorganic material layers are stacked, the standard encapsulation member may not achieve desired flexibility. In addition, if the standard encapsulation member includes the end portion in which only the organic material layers are stacked, the standard encapsulation member may not achieve desired moisture-proof properties.

The method of FIG. 9 includes forming the first material 420 having the third curved shape end portion, forming the second material layer 430 having the fourth curved shape end portion that partially exposes the third curved shape end portion of the first material layer 420 on the first material layer 420, and forming the third material layer 440 having the fifth curved shape end portion that covers the third curved shape end portion of the first material layer 420. In some embodiments, the first and third material layers 420 and 440 include an inorganic material and the second material layer 430 includes an organic material. In other embodiments, the first and third material layers 420 and 440 include an organic material and the second material layer 430 includes an inorganic material.

As a result, the encapsulation member may include a region in which only inorganic material layers are stacked and a region in which only organic material layers are stacked. That is, the encapsulation member may include both a region in which only inorganic material layers are stacked and a region in which only organic material layers are stacked. Therefore, the encapsulation member may achieve improved moisture-proof properties because the encapsulation member includes a region in which only inorganic layers are stacked and may achieve improved flexibility because the encapsulation member includes a region in which only organic layers are stacked.

Figure 13:
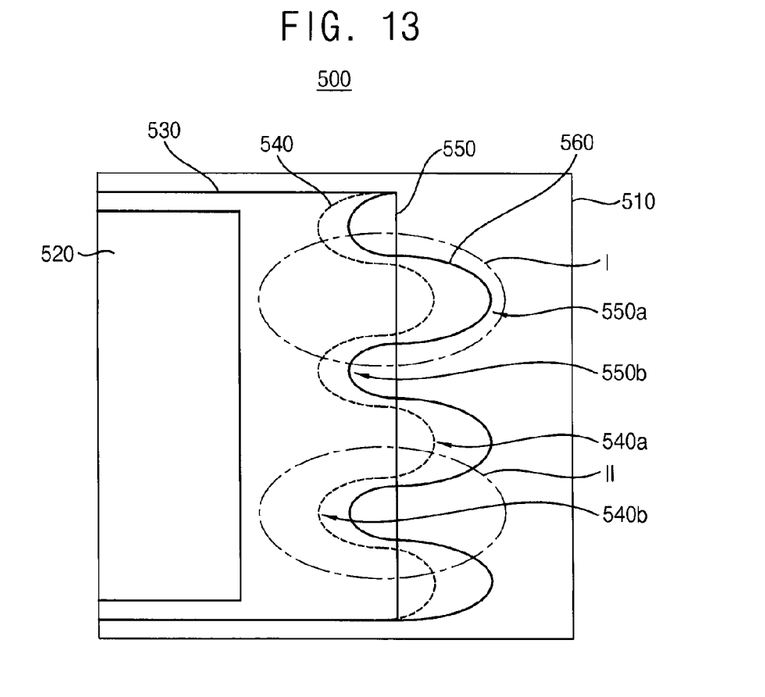
FIG. 13 is a plan view illustrating a display device according to an embodiment.

FIG. 13 is a plan view illustrating a display device according to an embodiment.

Referring to FIG. 13, a display device 500 may include a substrate 510, a display structure 520, and an encapsulation member 530.

The encapsulation member 530 may have a structure substantially the same as or similar to that of the encapsulation member 100 described with reference to FIG. 1. The encapsulation member 530 may have a structure substantially the same as or similar to that of the encapsulation member 200 described with reference to FIG. 3.

The substrate 510 may include a transparent insulation substrate. In some embodiments, the substrate 510 includes a flexible substrate. In other embodiments, the substrate 510 includes a glass substrate, a quartz substrate, a transparent resin substrate, etc.

The display structure 520 may be an organic light-emitting diode (OLED) display structure including organic light emitting layers or a liquid crystal display (LCD) structure including a liquid crystal layer.

The encapsulation member 530 may include a thin film type structure in which the first material layer 540, the second material layer 550, and the third material layer 560 are stacked.

The first material layer 540 may be formed on the substrate 510. The first material layer 540 may encapsulate a space between the substrate 510 and the first material layer 540 to prevent moisture and/or oxygen from penetrating from the environment into the space. In this embodiment, the first material layer 540 includes a first curved shape end portion in which first convex patterns 540a and first concave patterns 540b are alternately arranged.

For convenience of descriptions, a region in which the first convex patterns 540a are arranged on the substrate 510 may be defined as a convex portion I and a region in which the concave patterns 540b are arranged on the substrate 510 may be defined as a concave portion II. Thus, at least one material layer (e.g., the first material layer 540) may include the convex portion and/or the concave portion from a top view (i.e., plan view).

For example, the amplitude of the first convex patterns 540a in the direction that the first convex patterns 540a are arranged may be between about 80 um and about 500 um. Further, the amplitude of the first concave patterns 540b in the direction that the first concave patterns 540b are arranged may be between about 80 um and about 500 um. However, the amplitude of the first convex patterns 540a and the first concave patterns 540b are not limited thereto.

In some embodiments, the first material layer 540 includes an inorganic material layer. For example, the first material layer 540 may include at least one of aluminum oxide, titanium oxide, magnesium oxide, tin oxide, zinc oxide, copper oxide, silicon oxide, silicon nitride. In other embodiments, the first material layer 540 includes an organic material layer. For example, the first material layer 120 may include at least one of epoxy resin, acrylate resin, or urethane acrylate resin. Thus, the first material layer 540 may prevent moisture and/or oxygen from penetrating from the environment into the space (e.g., the space between the substrate 510 and the first material layer 540) and may relieve internal stress in the first and second material layers 540 and 550. In addition, the first material layer 540 may fill micro cracks and/or pin holes in the first and second material layers 540 and 550 to prevent moisture and/or oxygen penetration.

The second material layer 550 may be formed on the first material layer 540. The second material layer 550 may include a first linear shape end portion that partially covers the first curved shape end portion of the first material layer 540. Thus, the first linear shape end portion of the second material layer 550 may expose the first curved shape end portion of the first material layer 540. Here, the second material layer 550 may include a material different from that of the first material layer 540.

The second material layer 550 may include a convex portion I in which the first linear shape end portion of the second material layer 550 exposes the first curved shape end portion of the first material layer 540 and a concave portion II in which the first linear shape end portion of the second material layer 550 covers the first curved shape end portion of the first material layer 540. In these embodiments, the area of the second material layer 550 is less than the area of the first material layer 540 in the convex portion I. Additionally, the area of the second material layer 550 is greater than the area of first material layer 540 in the concave portion II.

In some embodiments, the second material layer 550 includes an inorganic material layer. For example, the second material layer 550 may include at least one of aluminum oxide, titanium oxide, magnesium oxide, tin oxide, zinc oxide, copper oxide, silicon oxide, or silicon nitride. In other embodiments, the second material layer 550 includes an organic material layer. For example, the second material layer 550 may include at least one of epoxy resin, acrylate resin, or urethane acrylate resin. Thus, the second material layer 550 may relieve internal stress in the first and the third material layers 540 and 560 or may fill micro cracks and/or pin holes in the first and third material layers 540 and 560 to prevent moisture and/or oxygen penetration.

The third material layer 560 may be formed on the second material layer 550. The third material layer 560 may include a second curved shape end portion in which second convex patterns 560a that cover the first curved shape end portion of the first material layer 540 and second concave patterns 560b that partially expose the first linear shape end portion of the second material layer 550 are alternately arranged. The third material layer 560 may include a material the same as or similar to that of the first material layer 540 and may have a function the same as or similar to that of the first material layer 540.

The third material layer 560 may include a convex portion I in which the second convex patterns 560a of the second curved shape end portion of the third material layer 560 covers the first linear shape end portion of the second material layer 550 and a concave portion II in which the second concave patterns 560b of the second curved shape end portion of the third material layer 560 partially exposes the first linear shape end portion of the second material layer 550. Here, the area of the third material layer 560 is greater than the area of the second material layer 550 in the convex portion I. Additionally, the area of the third material layer 560 is less than the area of the second material layer 550 in the concave portion II. Thus, at least one material layer (e.g., the first material layer 540 and/or the third material layer 560) may include the convex portion and/or the concave portion from a top view (i.e., plan view).

In some embodiments, the third material layer 560 includes an inorganic material layer. For example, the third material layer 560 may include at least one of aluminum oxide, titanium oxide, magnesium oxide, tin oxide, zinc oxide, copper oxide, silicon oxide, or silicon nitride. In other embodiments, the third material layer 560 includes an organic material layer. For example, the third material layer 560 may include at least one of epoxy resin, acrylate resin, or urethane acrylate resin.

In some embodiments, the first to third material layers 540, 550 and 560 have substantially the same thicknesses. In other embodiments, the first to third material layers 540, 550 and 560 have different thicknesses.

Although it is illustrated that the encapsulation member 530 includes the first through third material layers 540, 550 and 560, the described technology is not limited thereto. For example, the encapsulation member 530 may include a plurality of material layers (i.e., first through (N)th material layers, where N is an integer larger than or equal to 3).

The described technology may be applied to an electronic device including a display device. For example, the described technology may be applied to a monitor, a television, a digital information display device, a laptop, a digital camera, a cellular phone, a smart phone, a smart pad, a personal digital assistant (PDA), a portable multimedia player (PMP), an MP3 player, a navigation system, a video camcorder, a game console, etc.

The foregoing is illustrative of exemplary embodiments and is not to be construed as limiting thereof. Although a few exemplary embodiments have been described, those skilled in the art will readily appreciate that many modifications are possible in the embodiments without materially departing from the novel teachings and advantages of the described technology. Accordingly, all such modifications are intended to be included within the scope of the described technology as defined in the claims. Therefore, it is to be understood that the foregoing is illustrative of various example embodiments and is not to be construed as limited to the specific embodiments disclosed, and that modifications to the disclosed example embodiments, as well as other example embodiments, are intended to be included within the scope of the appended claims.

What is claimed is:

1. An encapsulation member for a display device, comprising:
    a first layer;
    a second layer formed over the first layer; and
    a third layer formed over the second layer,
    wherein the third layer is formed of the same material as that of the first layer, wherein an end of at least one of the first to third layers is curved,
    wherein the end of the first layer has a first curved shape forming a plurality of non-linear portions that are not covered by the second layer, and
    wherein the end of the second layer partially covers the end of the first layer, and
    wherein the first layer is formed at least partially of an organic material and wherein the second layer is formed at least partially of an inorganic material.

2. The encapsulation member of claim 1, wherein the first curved shape includes at least one first convex portion and at least one first concave portion that are alternately arranged.

3. The encapsulation member of claim 2, wherein the end of the second layer has a first linear shape that partially covers the end of the first layer.

4. The encapsulation member of claim 3, wherein the end of the third layer has a second curved shape including:
    at least one second convex portion that covers i) at least a part of the end of the first layer not covered by the second layer and ii) at least a part of the end of the second layer; and
    at least one second concave portion that does not cover the end of the second layer,
    wherein the at least one second convex portion and the at least one second concave portion are alternately arranged.

5. The encapsulation member of claim 2, wherein the end of the second layer has a second curved shape including i) at least one second convex portion that covers the first concave portion of the first layer and ii) at least one second concave portion that does not cover the first convex portion of the first layer and wherein the at least one second convex portion and the at least one second concave portion are alternately arranged.

6. The encapsulation member of claim 5, wherein the end of the third layer has a third curved shape including i) at least one third convex portion that covers the second concave portion of the second layer and ii) at least one third concave portion that does not cover the second convex portion of the second layer and wherein the at least one third convex portion and the at least one third concave portion are alternately arranged.

7. The encapsulation member of claim 1, wherein the first layer is formed at least partially of an inorganic material and wherein the second layer is formed at least partially of an organic material.

8. The encapsulation member of claim 7, wherein the inorganic material comprises at least one of aluminum oxide (AlOx), titanium oxide (TiOx), magnesium oxide (MgOx), tin oxide (SnOx), zinc oxide (ZnOx), copper oxide (CuOx), silicon oxide (SiOx), or silicon nitride (SiNx).

9. The encapsulation member of claim 7, wherein the organic material comprises at least one of epoxy resin, acrylate resin, or urethane acrylate resin.

10. The encapsulation member of claim 1, wherein the area of the third layer is greater than that of the first layer.

11. A display device, comprising:
    a substrate;
    a display unit having a plurality of pixels formed over the substrate; and
    an encapsulation member formed over the substrate and encapsulating the display unit,
    wherein the encapsulation member includes:
        a first layer;
        a second layer formed over the first layer; and
        a third layer formed over the second layer,
        wherein the third layer is formed of the same material as that of the first layer,
        wherein an end of at least one of the first to third layers is curved,
        wherein the end of the first layer has a first curved shape forming a plurality of non-linear portions that are not covered by the second layer,
        wherein the end of the second layer partially covers the end of the first layer,
    wherein the first curved shape includes at least one first convex portion and at least one first concave portion that are alternately arranged, and wherein the end of the second layer has a second curved shape including i) at least one second convex portion that covers the first concave portion of the first layer and ii) at least one second concave portion that does not cover the first convex portion of the first layer and wherein the at least one second convex portion and the at least one second concave portion are alternately arranged.

12. The display device of claim 11, wherein the end of the second layer has a first linear shape that partially covers the end of the first layer.

13. The display device of claim 12, wherein the end of the third layer has a second curved shape including:
    at least one second convex portion that covers i) at least a part of the end of the first layer not covered by the second layer and ii) at least a part of the end of the second layer; and
    at least one second concave portion that does not cover the end of the second layer,
    wherein the at least one second convex portion and the at least one second concave portion are alternately arranged.

14. The display device of claim 11, wherein the end of the third layer has a third curved shape including i) at least one third convex portion that covers the second concave portion of the second layer and ii) at least one third concave portion that does not cover the second convex portion of the second layer and wherein the at least one third convex portion and the at least one third concave portion are alternately arranged.

15. The display device of claim 11, wherein the area of the third layer is greater than that of the first layer.

16. A display device, comprising:
a substrate;
a display unit having a plurality of pixels formed over the substrate; and
an encapsulation member formed over the substrate and encapsulating the display unit,
wherein the encapsulation member includes a-first to third layers sequentially stacked on each other,
wherein at least two of the layers have different lengths,
wherein a first end of the first layer has a first curved shape forming a plurality of non-linear portions that are not covered by the second layer, and
wherein a second end of the second layer partially covers the first end of the first layer, and
wherein the first layer is formed at least partially of an organic material and wherein the second layer is formed at least partially of an inorganic material.

17. A The display device of claim 16, wherein:
a third end of the third layer partially covers the second end, and
the third layer is formed of the same material as the first layer.

18. The display device of claim 17, wherein the third end has a third curved shape forming a plurality of non-linear portions not covering the second end and wherein the third layer substantially completely overlaps the first layer.

* * * * *